(12) United States Patent
Kohno et al.

(10) Patent No.: US 7,771,796 B2
(45) Date of Patent: Aug. 10, 2010

(54) PLASMA PROCESSING METHOD AND FILM FORMING METHOD

(75) Inventors: Masayuki Kohno, Amagasaki (JP); Masaru Sasaki, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 1050 days.

(21) Appl. No.: 11/266,308

(22) Filed: Nov. 4, 2005

(65) Prior Publication Data
US 2006/0099799 A1 May 11, 2006

(30) Foreign Application Priority Data
Nov. 9, 2004 (JP) .............................. 2004-324713

(51) Int. Cl.
H05H 1/00 (2006.01)
C23C 16/00 (2006.01)

(52) U.S. Cl. .................................. 427/535; 427/255.28

(58) Field of Classification Search .................... None
See application file for complete search history.

(56) References Cited

U.S. PATENT DOCUMENTS

| | | | |
|---|---|---|---|
| 5,000,113 A * | 3/1991 | Wang et al. | 118/723 E |
| 6,103,601 A | 8/2000 | Lee et al. | |
| 6,374,770 B1 | 4/2002 | Lee et al. | |
| 6,790,788 B2 * | 9/2004 | Li et al. | 438/778 |
| 7,250,370 B2 * | 7/2007 | Chang et al. | 438/694 |
| 2003/0194496 A1 * | 10/2003 | Xu et al. | 427/255.28 |
| 2004/0115876 A1 * | 6/2004 | Goundar et al. | 438/200 |

FOREIGN PATENT DOCUMENTS

| | | |
|---|---|---|
| JP | 9-167767 | 6/1997 |
| JP | 2003-503849 | 1/2003 |
| WO | WO 03/095702 A2 | 11/2003 |

* cited by examiner

Primary Examiner—Shamim Ahmed
(74) Attorney, Agent, or Firm—Oblon, Spivak, McClelland, Maier & Neustadt, L.L.P.

(57) ABSTRACT

A plasma processing method of carrying out curing processing on a low dielectric constant film produced on a to-be-processed substrate by applying plasma thereto in a processing chamber of a plasma processing apparatus, includes the steps of: a) introducing, in the plasma processing chamber, a first gas having a function of stabilizing plasma and a second gas generating active hydrogen, and, after that; b) generating plasma, and carrying out curing processing on the low dielectric constant film.

13 Claims, 13 Drawing Sheets

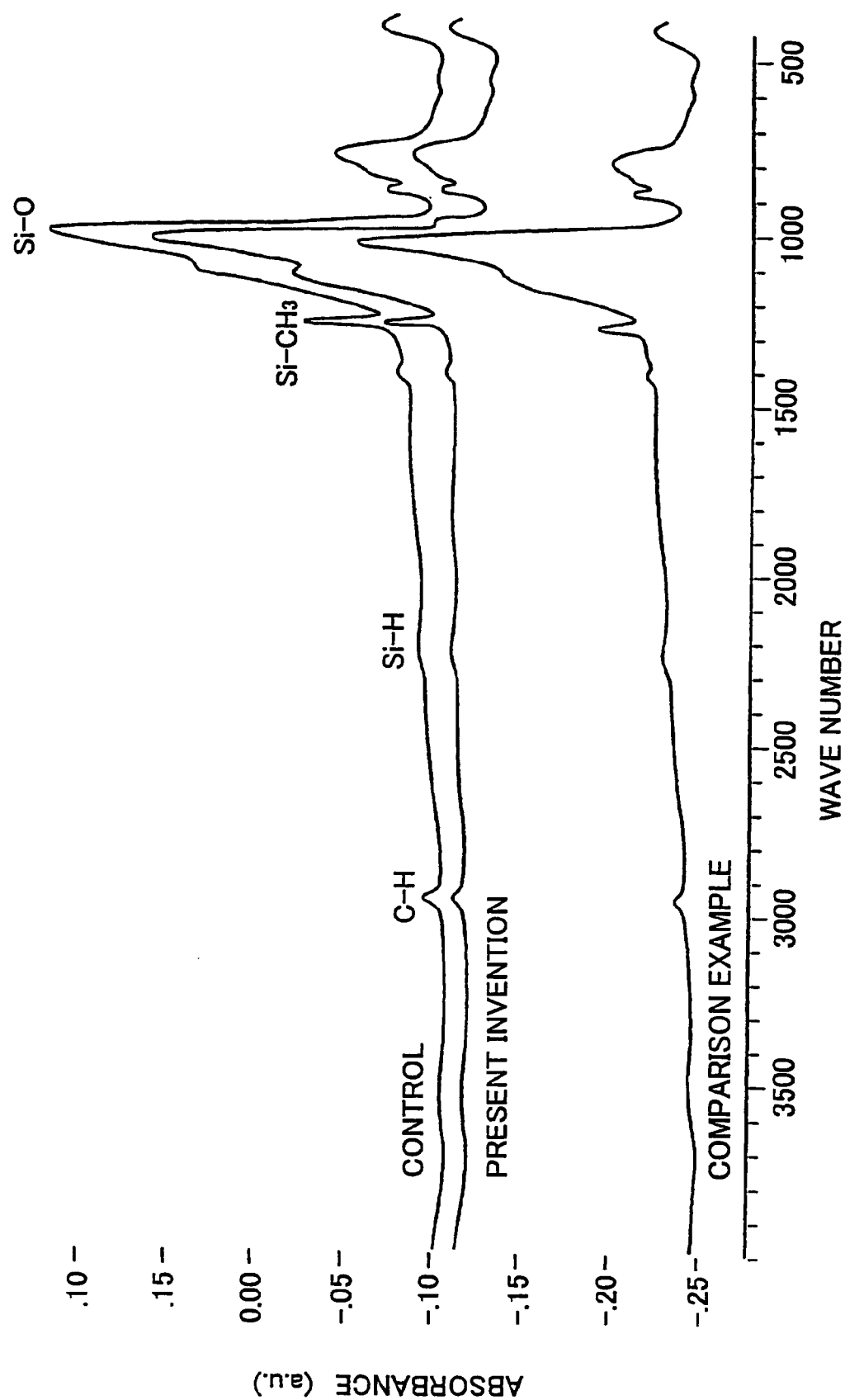

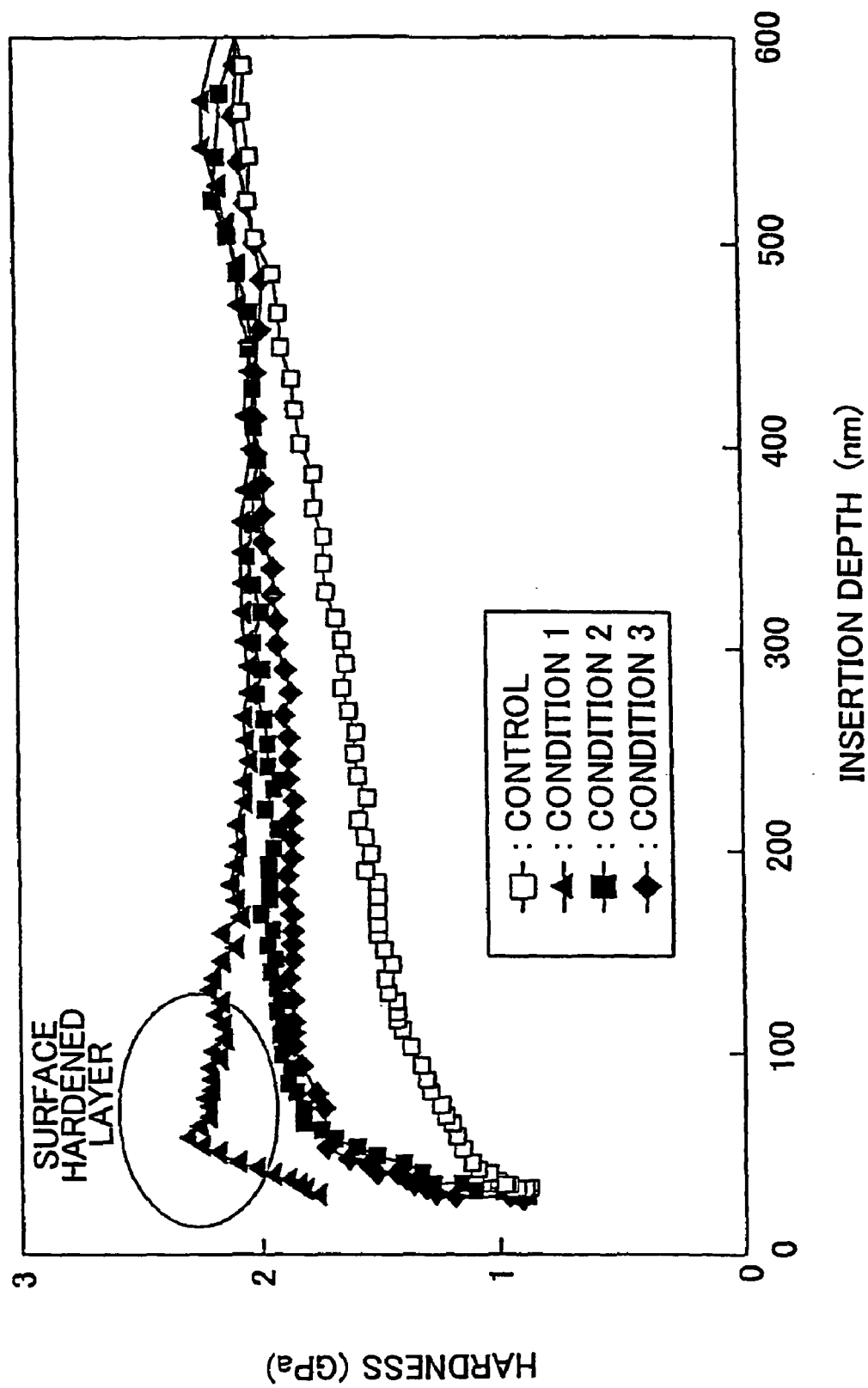

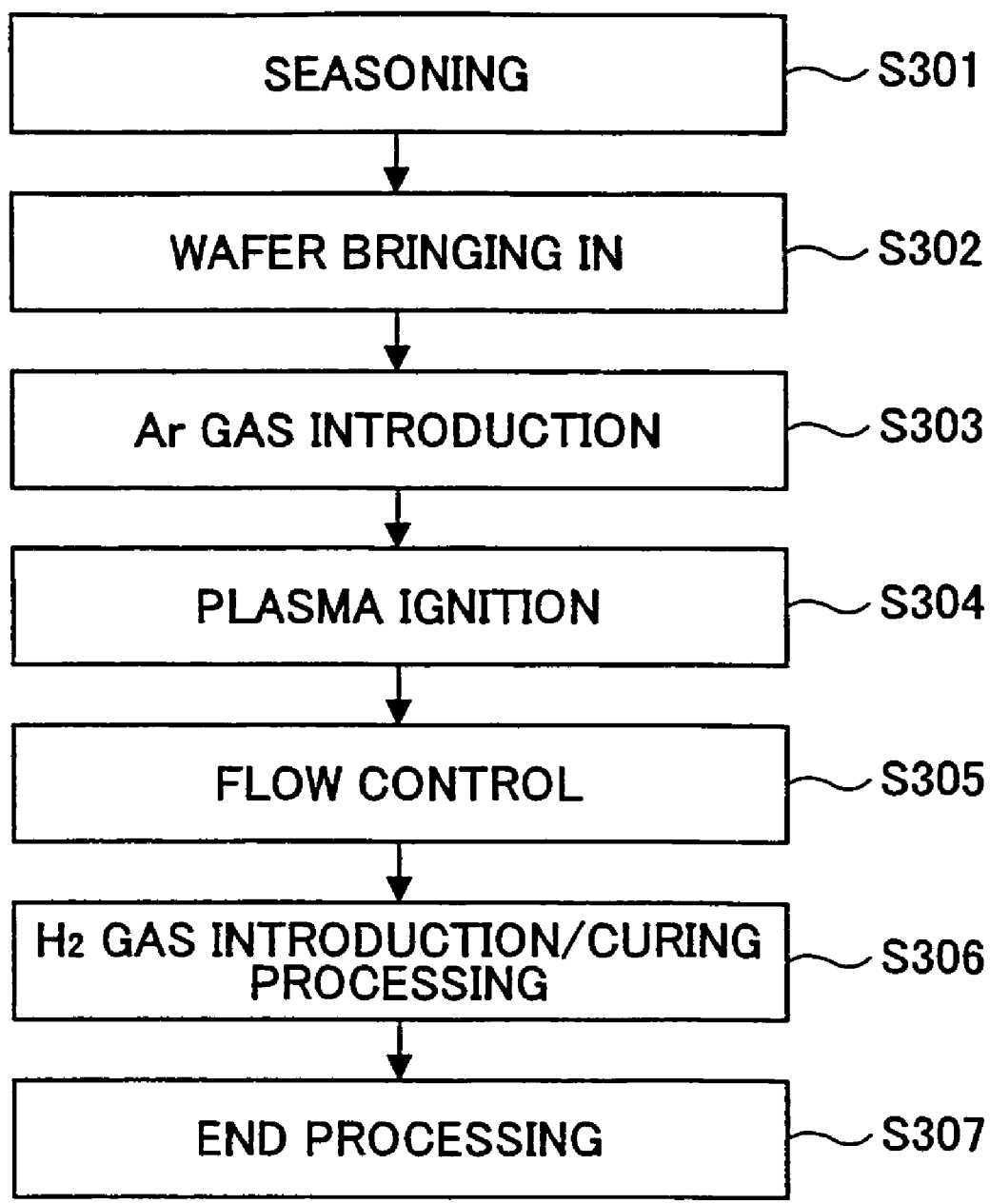

PLASMA PROCESSING METHOD AND FILM FORMING METHOD

BACKGROUND OF THE INVENTION

1. Field of the Invention

The present invention relates to a plasma processing method for processing a to-be-processed substrate such as a semiconductor substrate with the use of plasma, and a film forming method.

2. Description of the Related Art

In recent high-speed logic devices, reduction in dielectric constant (or obtaining Low-k) has been proceeded with, for the purpose of reducing interconnection capacitance. Further, study has been made for application of a porous material having large porosity for a very large-scale integrated circuit, and in particular, for a low dielectric constant film (i.e., a Low-k film) applied after a 65 nm technology node. Generally speaking, mechanical strength of such a porous Low-k film is low, and therefore, film peeling may occur, when copper is embedded and flattening is carried out in CMP after the Low-k film is produced. In order to avoid it, curing processing is previously required for the Low-k film, by thermal processing, UV processing, electron beam processing or such. Further, as plasma processing for such a Low-k film, a method of curing a Low-k film with the use of plasma of $H_2$ gas is disclosed by, for example, Japanese Laid-open Patent Application No. 2003-503849.

When plasma curing processing is carried out with the use of $H_2$ gas, a sequence of processing, such as that shown in FIG. 16, is carried out, for example.

First, after seasoning is carried not on the inside of a processing chamber (Step S301), a to-be-processed substrate is brought in the processing chamber (Step S302). Next, an Ar gas is introduced in the processing chamber for the purpose of stabilizing plasma, it is heated, and a pressure there is adjusted (Step S303). Then, plasma ignition is carried out, and thus, Ar plasma is generated (Step S304). After the plasma ignition, a flow rate of the Ar gas is controlled (Step S305), and the thus-generated Ar gas plasma is sufficiently stabilized. After that, an $H_2$ gas is introduced, and curing processing is started (Step S306). After the curing is completed, plasma is stopped, and predetermined end processing, such as exhaust processing and so forth, is carried out.

When curing processing of a Low-k film is carried out by the above-mentioned thermal processing, UV processing or electronic beam processing, degradation in the Low-k film may occur, such as an increase in a film shrinkage factor or such.

Further, when plasma processing is carried out on a Low-k film in a method such as that described above with reference to FIG. 16, a cured film is produced only in the vicinity of a surface of the Low-k film, and curing may not be carried out inside deeply. Thereby, in etching processing carried out after that for example, an etching rate may differ much between the vicinity of the surface and the inside of the Low-k film. Thus, proper control of an etched shape may become difficult. Furthermore, when only the vicinity of the surface of the film is cured, the original purpose of curing processing cannot be sufficiently achieved accordingly, a mechanical strength of the Low-k film may not be sufficiently increased, a wall part configuring a wiring pattern may fall down, and thus, a subsequent process may not be carried out. Further, since wetting property (adherence) may not be sufficient, and thus film peeling may occur, so that leakage electric current may increase.

SUMMARY OF THE INVENTION

An object of the present invention is to provide a plasma processing method by which, when curing processing is carried out on a Low-k film, the Low-k film can be made to have a reduced dielectric constant, curing can be carried out uniformly through out the entirety of the film, and also, adherence can be improved.

In order to solve the above-mentioned problem, according to a first aspect of the present invention, a plasma processing method for carrying out curing processing on a low dielectric constant film produced on a to-be-processed substrate by applying plasma thereto in a processing chamber of a plasma processing apparatus, comprising the steps of: a) introducing, in the plasma processing chamber, a first gas having a function of stabilizing plasma and a second gas generating active hydrogen, and, after that; b) generating plasma, and carrying out curing processing on the low dielectric constant film, is provided.

According to a second aspect of the present invention, a plasma processing method of carrying out curing processing on a low dielectric constant film produced on a to-be-processed substrate by applying plasma thereto in a processing chamber of a plasma processing apparatus, comprising the steps of: a) introducing, in the plasma processing chamber, a first gas having a function of stabilizing plasma, and a second gas generating active hydrogen, and, after that; b) introducing microwave in the processing chamber with the use of a planar antenna having a plurality of slots, generating plasma of the first gas and the second gas, and carrying out curing processing on the low dielectric constant film, is provided.

In the plasma processing method according to the first or the second aspect of the present invention, the first gas may preferably be an inert gas, and the second gas may preferably be an $H_2$ gas. In this case, a processing pressure may preferably lie in a range of 13.3 to 1333 [Pa]. Further, a flow rate ratio between the inert gas and the $H_2$ gas (inert gas:$H_2$ gas) may preferably lie in a range of 1:2 to 1:20. Further, the low dielectric constant film may preferably be any one of a SiOCH series film, a SiOC series film, an MSQ series film and an organic polymer series film.

According to a third aspect of the present invention, a film forming method comprising the steps of: a) forming a low dielectric constant film on a to-be-processed substrate in a manner of plasma CVD; and b) carrying out curing processing on the low dielectric constant film by causing plasma to function thereto, wherein: the step b) includes the steps of: b1) introducing, in a plasma processing chamber, a first gas having a function of stabilizing plasma, and a second gas generating active hydrogen; and, after that, b2) generating plasma in the plasma processing chamber, and carrying out curing processing on the low dielectric constant film, is provided.

According to a fourth aspect of the present invention, a control program comprising instructions for causing a computer to control a plasma processing apparatus so that the plasma processing apparatus carries out the respective steps of the plasma processing method according to the above-mentioned first or the second aspect of the present invention, is provided.

According to a fifth aspect of the present invention, a computer readable information recording medium storing therein the control program according to the fourth aspect of the present invention.

In the plasma processing method according to the present invention, by controlling a timing of plasma ignition, an influence of Ar ions or such on a low dielectric constant film produced on a to-be-processed substrate can be reduced to the utmost, and thus, uniform curing can be achieved with active hydrogen (such as hydrogen radicals, hydrogen ions or such) without an increase of a dielectric constant of the film.

BRIEF DESCRIPTION OF THE DRAWINGS

Other objects and further features of the present invention will become more apparent from the following detailed description when read in conjunction with the accompanying drawings:

FIG. 14 shows IR spectrums of a SiOCH film after curing processing in a comparison example and in the present invention;

FIG. 15 shows a hardness distribution of an SiOCH film after curing processing in a comparison example and in the present invention; and FIG. 16 shows a flow chart of plasma curing processing in one example of the related art.

DETAILED DESCRIPTION OF THE PREFERRED EMBODIMENTS

Embodiments of the present invention are described specifically with reference to figures.

As a low dielectric constant film directed to by curing processing according to the present invention, a Low-k film such as a SiOCH series film may be applied for example. In particular, according to the present invention, film curing can be achieved uniformly without an increase in a dielectric constant for a case where curing processing is carried out on a porous SiOCH series Low-k film, and thus, it is very advantageous. Further, the present invention may also be applicable for curing processing of an interlayer dielectric or such of another Low-k film, such as a SiOC series film such as a SiOC film or a porous SiOC film, a CF series film, an organic polymer series film, a MSQ series film such as a MSQ film or porous MSQ film, or such.

A thickness of the Low-k film is not limited. However, for example, one in a range of 100 to 1000 nm is preferable.

A Low-k film may be formed, for a SiOCH series film for example, with an organosilicon compound such as a tetramethylsilane (TMS), 1,1,3,3-tetramethyldisiloxane (TMDS), cyclohexyldimethoxymethylsilane (CHDMMS) or such applied as a raw material, with the use of a parallel flat plate type (electric capacitance type) plasma CVD apparatus, a configuration of which is well-known, under predetermined pressure and temperature with an oxidant such as oxygen. Preferably, a to-be-processed substrate is brought in a plasma CVD apparatus for example, an organosilicon compound and an oxidant are introduced at a flow rate in a range of 100 to 300 mL/min. and with a flow rate in a range of 100 to 300 mL/min., respectively, with a pressure in a range of 133 to 400 Pa (or 1 to 3 Torrs), at a temperature of the to-be-processed substrate in a range of 0 to 70° C., a high frequency electric power of hundreds of kilohertz is provided with an output in a range of 200 to 300 W, plasma processing is carried out, and thus, film forming can be achieved. As other plasma, inductive coupling plasma (ICP) may be applied.

Figure 1:
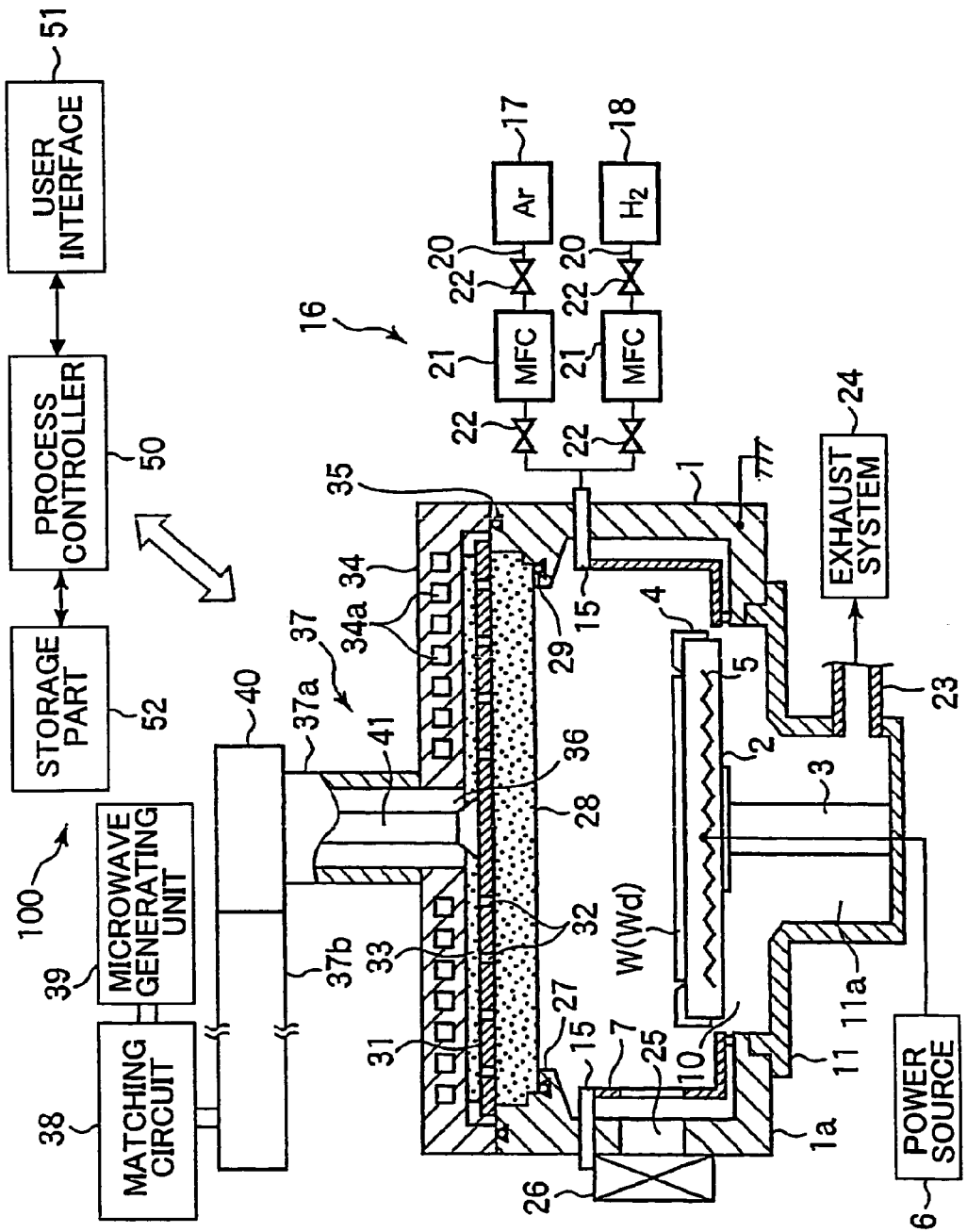
FIG. 1 shows a sectional view diagrammatically showing one example of a plasma processing apparatus suitable for curing processing according to one embodiment of the present invention.

FIG. 1 shows a sectional view, diagrammatically showing one example of a plasma processing apparatus in which a Low-k film curing processing according to one embodiment of the present invention is carried out. In this plasma processing apparatus, microwave is introduced in a processing chamber with the use of a planar antenna having a plurality of slots, in particular, an RLSA (Radial Line Slot Antenna), and thus, plasma is generated. Thus, the plasma processing apparatus is configured as an RLSA microwave plasma processing apparatus, and thereby, microwave plasma with a high density at a low electron temperature can be generated. Such a type of processing apparatus is one which is preferably applicable for curing a Low-k film, for example. This plasma processing apparatus is configured to have an air tight structure, and has an approximately cylindrical chamber 1 which is grounded. A circular opening part 10 is produced at an approximately center of a bottom wall 1a of the chamber 1, and, also, an exhaust container 11, which communicates with the opening part 10 and projects downward, is provided in the bottom wall 1a.

Inside the chamber 1, a susceptor 2 (mount table), made of ceramics such as AlN, is provided for horizontally supporting a wafer W or a dummy wafer Wd, acting as a to-be-processed substrate, is provided. This susceptor 2 is supported by a cylindrical supporting member 3, made of ceramics such as AlN, extending upward from a bottom center of the exhaust container 11. A guide ring 4 is provided for guiding the wafer W in the periphery of the susceptor 2. Further, in the susceptor 2, a resistance heating type heater 5 is embedded, and, this heater 5 heats the susceptor 2 with power supply from a heater power source 6, and heats the wafer W, the to-be-processed substrate. At this time, a temperature can be controlled in a range of a room temperature to 800° C., for example. On an inner circumferential wall of the chamber 1, a cylindrical liner 7, made of quartz, is provided.

A wafer supporting pin (not shown) for supporting and lifting or lowering the wafer W is provided on a surface of the susceptor 2 in a manner such that the wafer supporting pin may project therefrom or retreat therein.

A ring-shaped gas introducing member 15 is provided on a side wall of the chamber 1, and a gas supply system 16 is connected to the gas introducing member 15. The gas introducing member 15 may instead be disposed like a shower. This gas supply system 16 has for example an Ar gas supply source 17 for supplying an Ar gas as a first gas having a function to stabilize plasma and a $H_2$ gas source 18 for supplying an $H_2$ gas as a second gas for generating active hydrogen such as hydrogen radicals, hydrogen ions or such. These gases are provided to the gas introducing member 15 via respective gas lines 20, and are introduced in the chamber 1 from the gas introducing member 15. Each of the gas lines 20 is provided with a mass flow controller 21 and valves 22 provided before and after the mass flow controller 21. As the first gas, an inert gas of the rare gas such as Kr, Xe, He or such may be applied instead of the Ar gas.

An exhaust pipe 23 is connected to a side wall of the above-mentioned exhaust container 11, and an exhaust system 24 including a high-speed vacuum pump is connected to the exhaust pipe 23. As a result of the exhaust system being operated, a gas in the chamber 1 is uniformly discharged to a space 11a of the exhaust container 11, and is discharged via the exhaust pipe 23. Thereby, the inside of the chamber 1 is reduced in pressure in a predetermined vacuum state, for example, 0.133 Pa at a high speed.

On the side wall of the chamber 1, a carry-in/out opening 25 for carrying a wafer W or a dummy wafer Wd in or out from a transfer chamber (not shown) adjacent to the plasma processing apparatus 100, and a gate valve 26 for opening or closing the carrying-in/out opening 25 are provided.

An opening part is provided at a top of the chamber 1, a ring-shaped supporting part 27 is provided along a circumferential periphery of the opening part, and a microwave transmitting plate 28 transmitting microwave, made of a dielectric, for example, quartz, ceramics such as $Al_2O_3$, AlN or such, is provided on the supporting part 27 via a sealing member 29. Thus, the chamber 1 is kept airtight.

Figure 2:
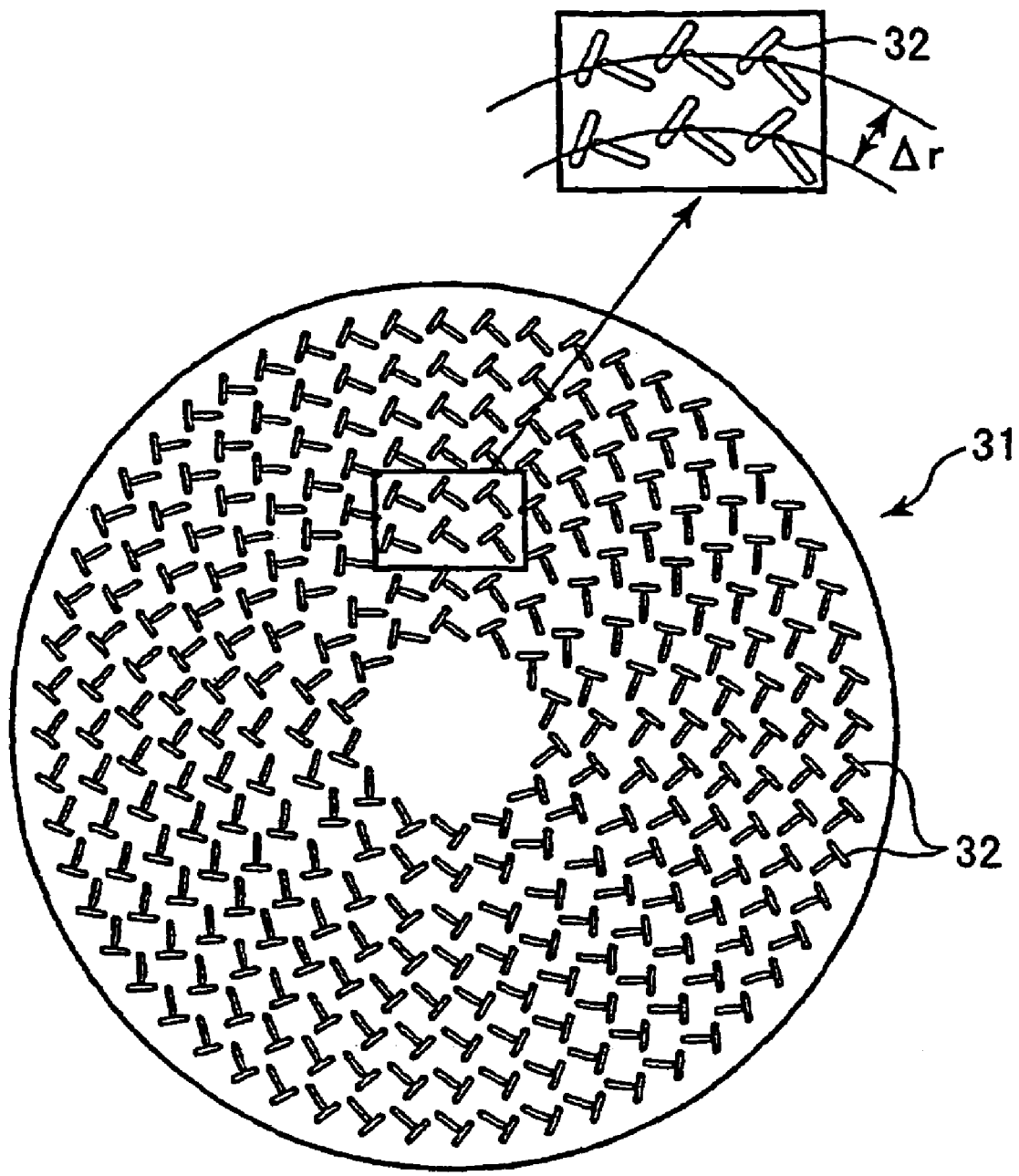
FIG. 2 shows a configuration of a planar antenna applied in the plasma processing apparatus shown in FIG. 1.

Above the microwave transmitting plate 28, a disk-shaped or angle-shaped planar antenna member 31 is provided, to face the susceptor 2. This planar antenna member 31 is mounted on a top end of the side wall of the chamber 1. The planar antenna member 31 is made of, for example, a copper plate or an aluminum plate, a surface of which is plated by gold or silver, and is configured in such a manner that plural microwave radiation holes 32 (slots) are provided in a predetermined pattern, each of which passes through a body of the planar antenna member 31. These microwave radiation holes 32 are like long grooves, as shown in FIG. 2, and, typically, are disposed in such a manner that each adjacent microwave radiation holes 32 form a 'T' letter, and these microwave radiation holes 32 are disposed concentrically. Lengths, arrangements and separations of these microwave radiation holes 32 are determined depending on a wavelength of microwave actually applied, or such. It is noted that, in FIG. 2, Δr denotes a separation, in a radial direction, between adjacent microwave radiation holes 32 disposed concentrically. The microwave radiation holes 32 may have other shapes, for example, circular shapes, arc shapes, or such. Further, arrangement of the microwave radiation holes 32 are not limited. Other than the concentric arrangement, a spiral arrangement, a radial arrangement or such may be applied.

On the top surface of the planar antenna member 31, a slow wave member 33, having a dielectric constant larger than that of a vacuum is provided. This slow wave member 33 has a function of adjusting plasma by shortening a wavelength of microwave because a wavelength of microwave increases in a vacuum. The planar antenna member 31 and the microwave transmitting plate 28 are in a close contact state therebetween, and also, the slow wave member 33 and the planar antenna member 31 are in a close contact state therebetween.

On the top surface of the chamber 1, a shield lid part 34 made of metal material such aluminum, stainless steal or such is provided to cover the planar antenna member 31 and the slow wave member 33. The top surface of the chamber 1 and the shield lid part 34 are sealed by a sealing member 35. Cooling water flow paths 34a are provided in the shield lid part 34, and, by flowing cooling water therethrough, the shield lid part 34, the slow wave member 33, the planar antenna member 31 and the microwave transmitting plate 28 are cooled. The shield lid part 34 is grounded.

An opening part 36 is provided at a centre of a top wall of the shield lid part 34, and a waveguide tube 37 is connected to the opening part 36. At an end of the waveguide tube 37, a microwave generating system 39 is connected via a matching circuit 38. Microwave having a frequency of 2.45 GHz, generated by the microwave generating system 39, propagates to the planar antenna member 31 via the waveguide tube 37. It is noted that, as a frequency of the microwave, 8.35 GHz, 1.98 GHz or such may be applied instead.

The waveguide tube 37 has a coaxial waveguide tube 37a, having a circular sectional shape, extending upward from the opening part 36 of the shield lid part 34, and a rectangular waveguide tube 37b, having a rectangular sectional shape, connected to a top part of the coaxial weave guide tube 37b via a mode transducer 40 and extending horizontally. The mode transducer 40 between the coaxial waveguide tube 37a and the rectangular waveguide tube 37b has a function of transducing microwave propagating in a TE mode in the rectangular waveguide tube 37b into a TEM mode. An inner conductor 41 extends at a center of the coaxial waveguide tube 37a, and the inner conductor 41 is connected to a center of the planar antenna member 31 at a bottom. Thereby, microwave is efficiently and uniformly made to propagate to the planar antenna member 31 via the inner conductor 41 of the coaxial waveguide tube 37a.

The respective parts of the plasma processing apparatus 100 are connected with and controlled by a process controller 50 including a CPU. The process controller 50 has a user interface 51 including a keyboard for inputting commands for managing the plasma processing apparatus 100, a display device for displaying operation states of the plasma processing apparatus 100, and so forth.

Further, a storage part 52, storing recipes recording control programs (software) for achieving various types of processing carried out by the plasma processing apparatus 100 under the control of the process controller 50, and processing condition data and so forth, is connected to the process controller 50.

Then, as the necessity arises, an arbitrary recipe is called from the storage part 52 in response to instructions from the user interface 51 or such, and is executed by the process controller 50. Thus, under the control of the process controller 50, desired processing is carried out by the plasma processing apparatus 100. The recipes such as the control programs, processing condition data and so forth may be previously stored in a computer readable information recording medium such as a CD-ROM, a hard disk drive, a flexible disk, a nonvolatile memory or such, from which the CPU reads the recipe to execute. Alternatively, the recipes may be utilized in an online manner from another apparatus connected via a special communication line, where the recipe is transmitted, at a required occasion, to be executed by the CPU of the process controller 50.

Figure 3:
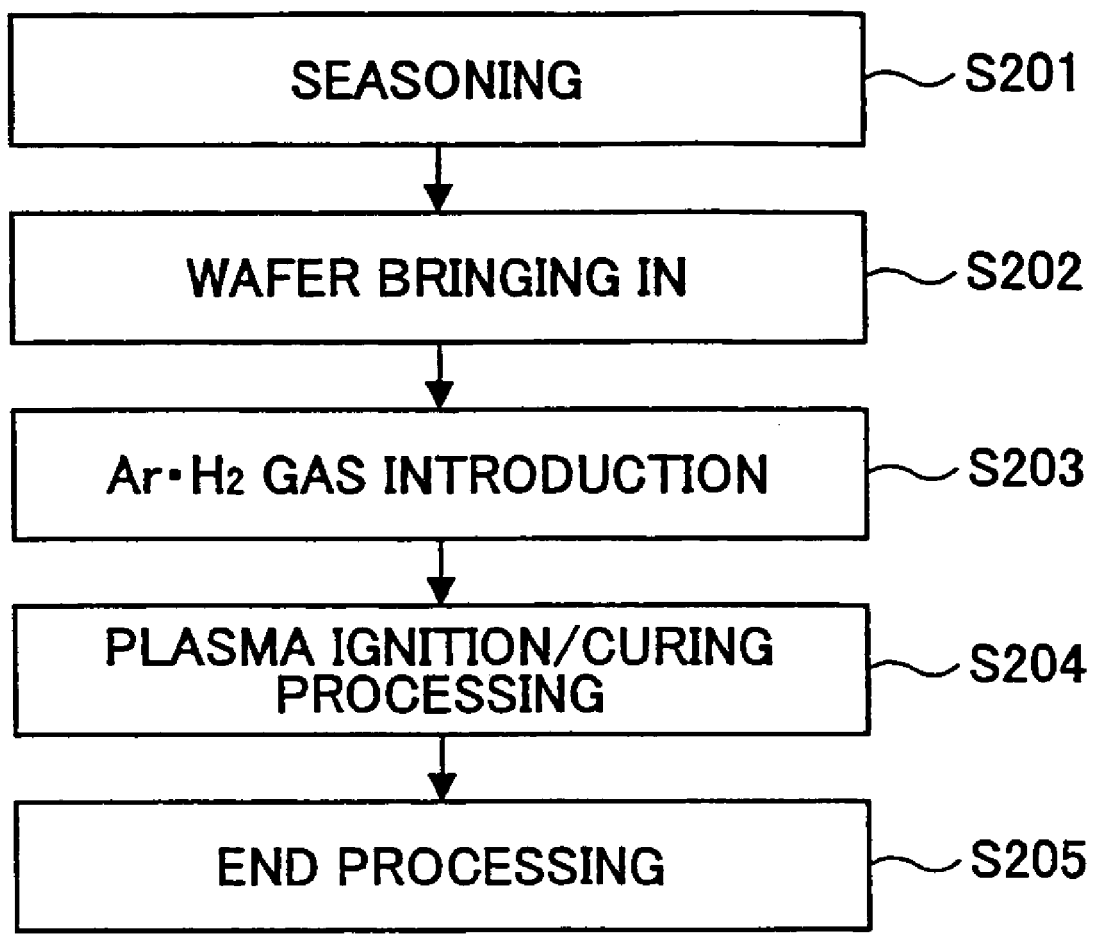
FIG. 3 shows a flow chart of one example of curing processing according to the present invention.

In the RLSA microwave plasma processing apparatus 100 configured as described above, curing processing can be carried out on a Low-k film produced on a wafer W in the following procedure described with reference to FIG. 3.

First, in Step S201, seasoning of the chamber 1 is carried out. This is carried out for the purpose for preparing an atmosphere inside of the chamber 1 before actually bringing a wafer W therein. Actually, the seasoning is carried out for several seconds for example in a condition according to the recipe, the same as that of plasma processing described later. The seasoning is carried out on a dummy wafer Wd which is a first wafer W of a lot.

After the seasoning is completed in Step S201, a wafer W on which a Low-k film is produced is brought in the chamber 1 from the carrying-in/out opening 25 through the gate valve 26 opened for this purpose, in Step S202.

In Step S203, an Ar gas and an $H_2$ gas are introduced in the chamber 1 via the gas introducing member 15 at predetermined flow rates from the Ar gas supply source 17 and the $H_2$ gas supply source 18 of the gas supply system 16.

Specifically, for example, the inert gas flow rate of Ar or such is set in a range of 50 to 1000 mL/min (sccm), and the $H_2$ gas flow rate is set in a range of 50 to 2000 mL/min (sccm). The inside of the chamber 1 is adjusted in a processing pressure in a range of 13.3 to 1333 Pa (or 100 [mTorrs] to 10 [Torrs]), or more preferably, in a range of 93.3 to 666.5 Pa. A temperature of the wafer W is heated on the order of a range of 300 to 500° C.

In order to obtain a uniformly cured film, the higher processing pressure is preferable, and, may preferably be in a range of 133.3 to 1333 Pa, as mentioned above. In order to obtain the same effect, a gas flow rate ratio between the inert gas such as Ar and the $H_2$ gas should be preferably in a range of 1:2 to 1:20, or, especially, a hydrogen rich condition is further preferably. That is, the gas flow rate ratio between the inert gas such as Ar and the $H_2$ gas may be preferably, in a range not less than 1:5, or further preferably, not less than 1:10. Further, the flow rate ratio of hydrogen with respect to the total gas flow rate may be preferably in a range of 0.04 to 1.

In Step S204, plasma ignition is carried out, and curing processing is carried out preferably in such a hydrogen rich condition. Plasma ignition is carried out as a result of microwave being introduced in the chamber 1.

That is, microwave from the microwave generating system 39 is lead to the waveguide tube 37 via the matching circuit 38, is then provided to the planar antenna member 31 via the rectangular waveguide tube 37b, the mode transducer 40 and the coaxial waveguide tube 37a in the stated order, and, from the planar antenna member 31, microwave is made to radiate to a space above the wafer W in the chamber 1, via the microwave transmitting plate 28. Microwave propagates in the rectangular waveguide tube 37b in a TE mode, is then transduced into a TEM mode by the mode transducer 40, and then propagates in the coaxial waveguide tube 37b for the planar antenna member 31. By means of radiation of microwave in the chamber 1 via the microwave transmitting plate 28 from the planar antenna member 31, an electromagnetic field is generated in the chamber 1, and thereby, the Ar gas and the $H_2$ gas become plasma. The thus-obtained microwave plasma is high density plasma approximately in a range of $5 \times 10^{10}$ to $1 \times 10^{13}/cm^3$ or more, as a result of the microwave radiating via the many microwave radiation holes 32 of the planar antenna 31. An electron temperature of the plasma is on the order of a range of 0.7 to 2 eV, and uniformity of the plasma density is not more than ±5%. As a result, curing processing can be carried out at a low temperature within a reduced time. Further, since the plasma with the low electron temperature is thus applied, a plasma damage made by ions or such on a foundation layer can be advantageously reduced.

Further, thanks to a function of mainly hydrogen radicals (H*) or hydrogen ions (H$^+$) of the hydrogen rich plasma, Si—CH$_3$ in the film is replaced by Si—CH$_2$—Si for a case where the Low-k film is a SiOCH film for example, bonding becomes strengthened, and thus, curing is achieved.

In Step S205, end processing is carried out. That is, after the curing processing of the wafer W in Step S204, supply of microwave is stopped with the pressure and the gas flow rate kept unchanged, and thus, the plasma is stopped. After that, gas supply is stopped, the gas is discharged from the chamber 1 by the exhaust system 24, the gate value 26 is opened, and thus, the wafer W is brought out.

Thus, according to the Low-k film curing processing method according to the present invention, a Low-k film can be cured uniformly through the sequence of the steps illustrated in Steps S201 through S205 described above, with the use of the plasma processing apparatus 100 shown in FIG. 1.

The above-mentioned phenomenon that a cured layer is produced only in the vicinity of a surface of a Low-k film during plasma processing in the related art (see FIG. 16) occurs presumably because an ion component such as Ar ions in plasma eliminates alkyl groups such as methyl groups or alkoxy groups from the Low-k film so that modification proceeds, and simultaneously, polarization of molecules in the film also proceeds. As one cause of the phenomenon that curing proceeds only in the vicinity of a surface of the Low-k film, a timing of plasma generation (plasma ignition) has a deep influence. For example, the following process is presumed. That is, in the processing procedure shown in FIG. 16, only an Ar gas is introduced in Step S303, and, plasma ignition is carried out in Step S304 before an $H_2$ gas is introduced in Step S306. Therefore, a time in which the Low-k film is exposed only to the Ar gas exists. The Ar gas has an important function to stabilize the plasma. However, since plasma of an only Ar gas has a high ion density and high ion energy, methyl groups or such are eliminated from a surface of the Low-k film by a function of the ions in this stage, and as a result, only the Low-k film surface is modified. Therefore, even when the $H_2$ gas is introduced after that for generating H* contributing to curing of the Low-k film, such a curing result that the entirety of the film is uniformly cured does not proceed, and thus, a cured layer is produced only in the vicinity of the film surface. In consideration of this matter, according to the present invention, since $H_2$ is included in the Ar gas and plasma ignition is made, energy of Ar is controlled. Then, in this condition, $H_2$ plasma is used to carry out curing processing so as to harden the Low-k film. Thereby, a Low-k film can be uniformly cured while a low dielectric constant is maintained or is further reduced, and thus, a satisfactory film quality is ensured.

Next, a result of a test carried out for proving the advantages of the present invention is described. It is noted that, in the test described below, as a Low-k film, a SiOCH film, formed on a wafer W with a film thickness of 45 nm for example with the use of a plasma CVD apparatus in a parallel flat plate type, was applied.

Light emission intensity of methyl groups generated in the chamber when plasma curing processing was carried out on the SiOCH film formed in CVD according to a method described below was measured (applying a wavelength of 431 nm).

Figure 4:
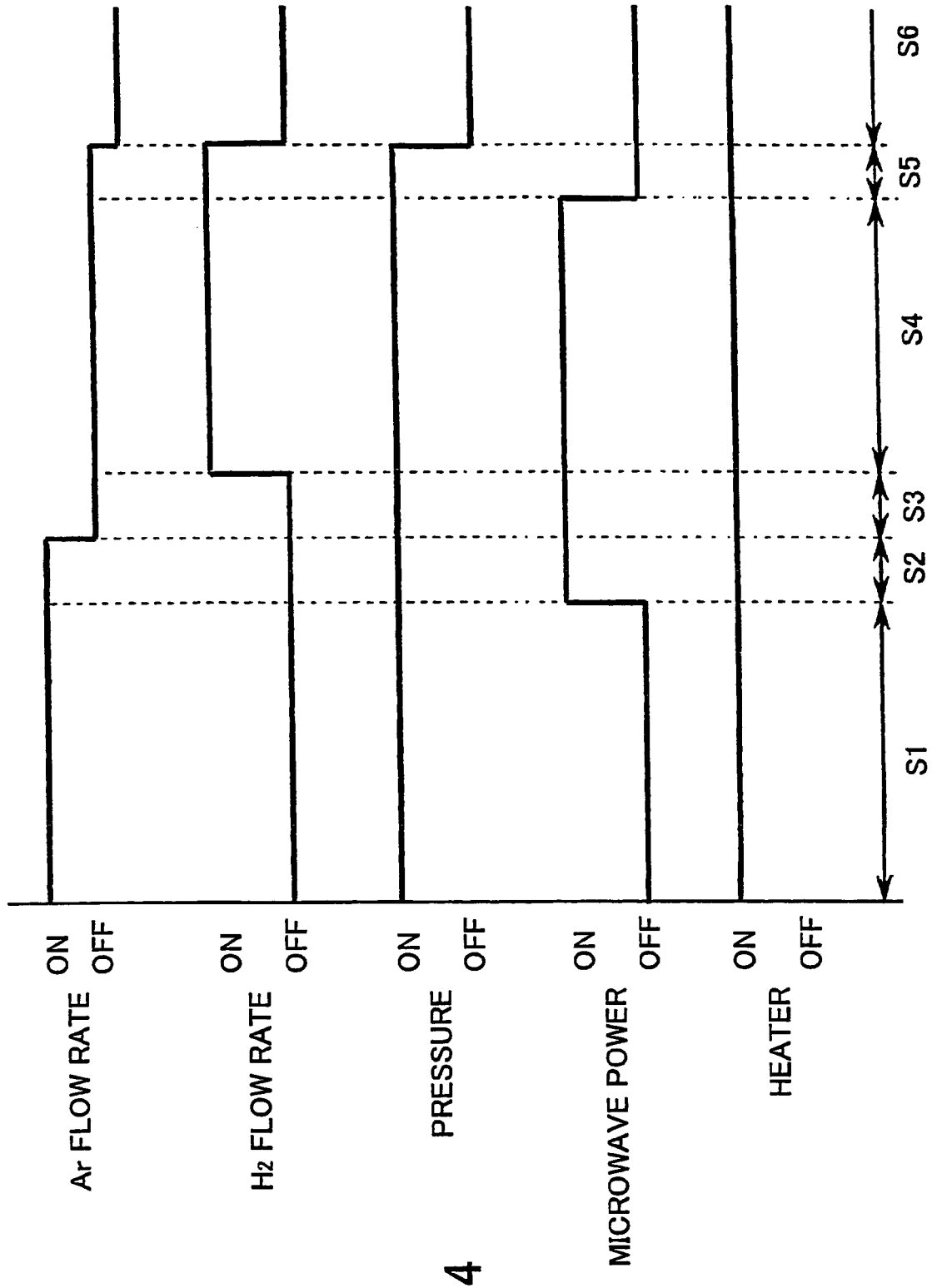
FIG. 4 shows a timing chart in a comparison example.

First, as a comparison example, plasma curing processing was carried out in a procedure of Steps S1 through S6 shown in FIG. 4. It is noted that a pressure in the chamber was 266.6

Pa (2 Torrs), microwave power was 2.0 kW, and a curing processing time was 60 seconds.

Figure 5:
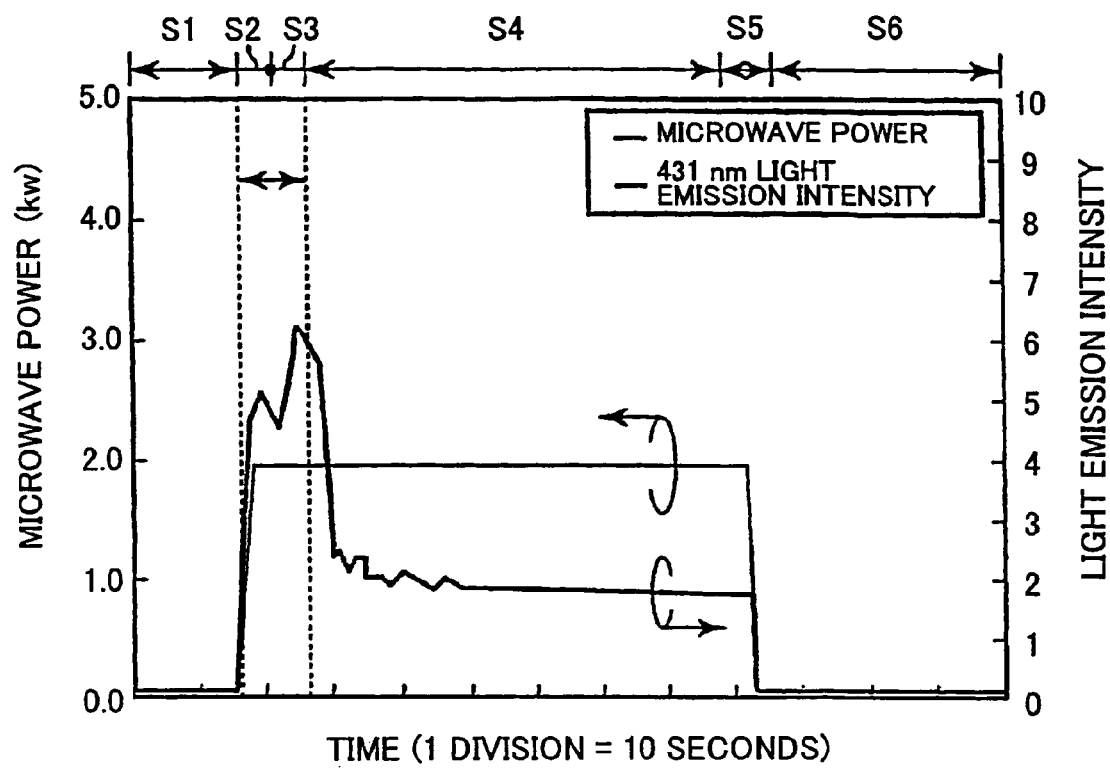
FIG. 5 shows a transition of microwave power and methyl group light emission intensity in a comparison example.

In this case, the SiOCH film was exposed to Ar for total 10 seconds during Steps S2 and S3 before curing processing of Step S4 by Ar/$H_2$ gas plasma. FIG. 5 shows a transition of microwave power and methyl group light emission intensity in the curing processing of the comparison example. It is noted that the methyl group light emission intensity was shown in a normalized value.

Figure 6:
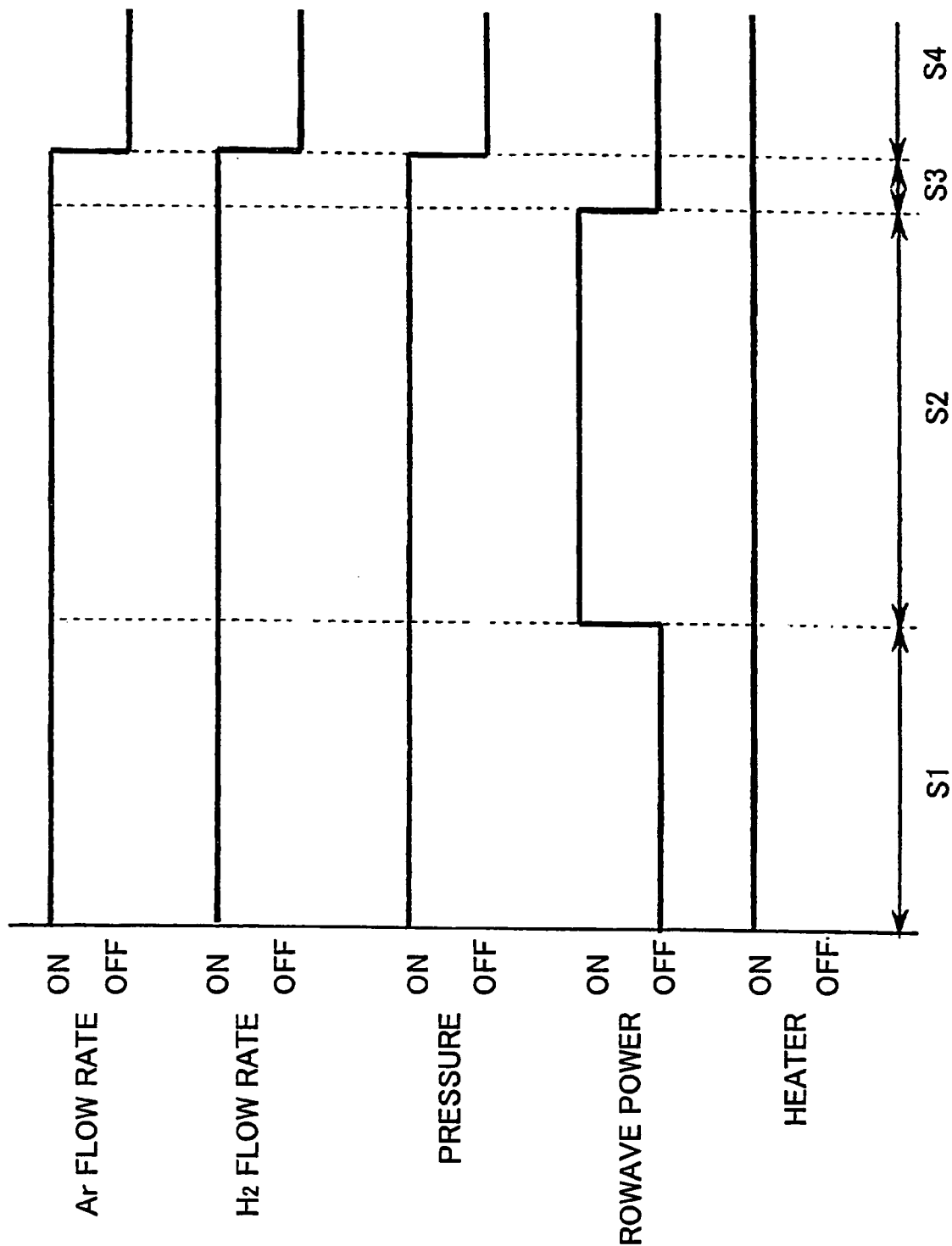
FIG. 6 shows a timing chart according to the present invention.

Next, in a procedure of Steps S1 and S4 of FIG. 6, plasma processing was carried out in a method according to the present invention. It is noted that, an Ar gas flow rate was 250 mL/min., an $H_2$ gas flow rate was 500 mL/min., a pressure in the chamber was 266.6 Pa (2 Torrs), microwave power was 2.0 kW, a pre-heating time was in a range of 20 to 60 seconds, and a curing processing time was 60 seconds.

In this case, plasma ignition timing was differed, microwave was provided and plasma ignition was carried out in Step S2 after an $H_2$ gas was introduced, and curing processing was carried out. As a result, a time in which a wafer W was exposed to only Ar gas plasma was zero seconds. FIG. 6 shows a transition of microwave power and methyl group light emission intensity in the curing processing according to the present invention. It is noted that the methyl group light emission intensity was shown in a normalized value.

As can be seen from FIG. 5, in the comparison example, the methyl group light emission intensity sharply increased from the only Ar gas plasma ignition, a state in which the methyl group light emission intensity was high is maintained for 10 seconds in a period (Steps S2 and S3) of the only Ar gas plasma, then the methyl group light emission intensity decreased to the order of 2 after the $H_2$ gas ignition in Step S4, and Ar/$H_2$ plasma was generated. After that, the methyl group light emission intensity behaved stable. That is, since Ar gas plasma has high $Ar^+$ ion energy, bonding of Si—$CH_3$ in the Low-k film was broken, a composition in which Si—H was dominant resulted, and thus, only a surface of the film was hardened.

Figure 7:
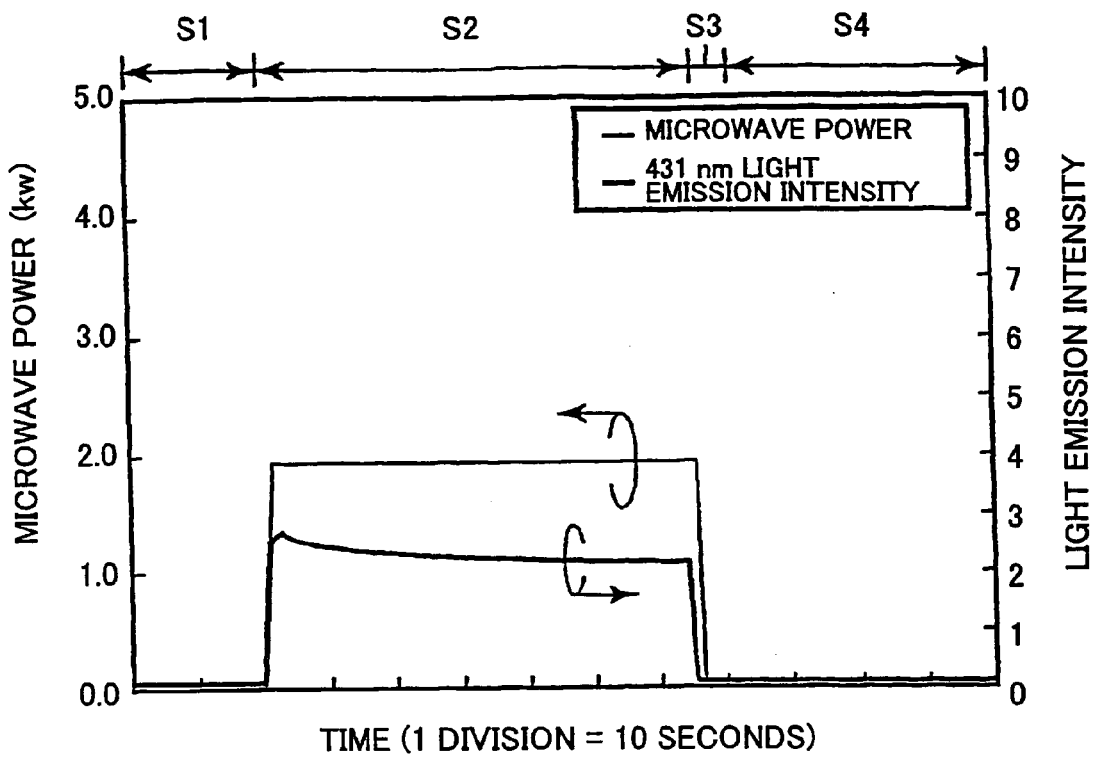
FIG. 7 shows a transition of microwave power and methyl group light emission intensity according to the present invention.

On the other hand, according to the present invention, as can be seen from FIG. 7, since an $H_2$ gas was introduced at a time of plasma ignition, although the methyl group light emission intensity increased to the order of 2 upon the Ar/$H_2$ gas plasma ignition in Step S2, the same behaved stable after that, and the methyl group light emission intensity was prevented from remarkably increasing up to the end of the curing processing.

Thus, it has been found out that, by carrying out the plasma ignition after introducing the $H_2$ gas, elimination of methyl groups from the SiOCH film can be inhibited.

Figure 8:
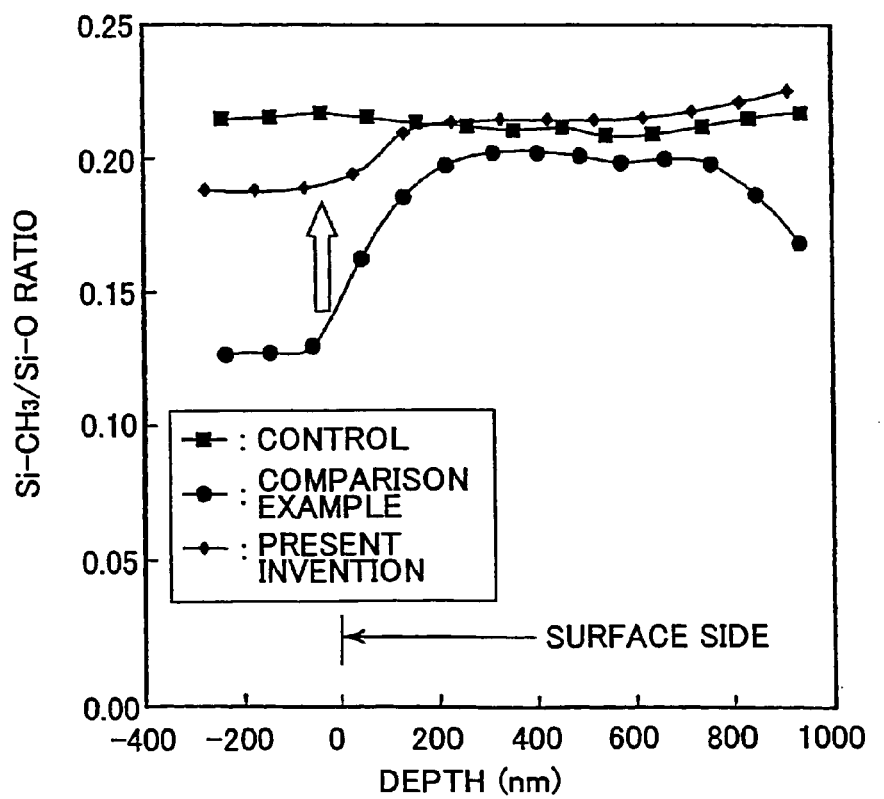
FIG. 8 shows a relationship between a depth of a SiOCH film and a Si—$CH_3$/Si—O ratio in a comparison example and in the present invention.
Figure 9:
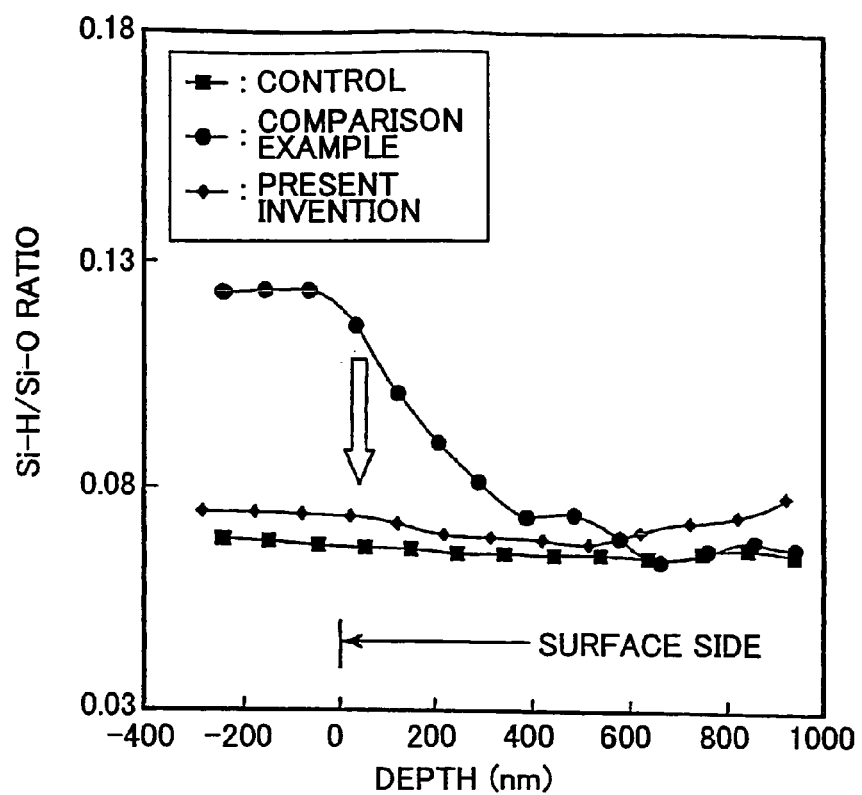
FIG. 9 shows a relationship between a depth of a SiOCH film and a Si—H/Si—O ratio in a comparison example and in the present invention.

Next, after curing processing was carried out on a SiOCH film in a condition differed as described below, the film was cut obliquely from a surface to a foundation layer, and a composition analysis was carried out on the cut surface in FT-IR (Fourier Transform Infrared Spectroscopy). FIG. 8 shows a relationship between a depth of the cut surface (nm) and a ratio between Si—$CH_3$ and Si—O (Si—$CH_3$/Si—O). FIG. 9 shows a relationship between a depth of the cut surface (nm) and a ratio between Si—H and Si—O (Si—H/Si—O).

<Curing Processing Condition>

(1) Present Invention ($H_2$ gas introduction ignition):
Ar/$H_2$ gas flow rate ratio=50/500;
Pressure in the chamber=approximately 400 Pa (3 Torrs);
Microwave Power=2 kW;
Wafer temperature=400° C.; and
Processing time=60 seconds.

(2) Comparison Example (ignition before $H_2$ gas introduction):
Ar/$H_2$ gas flow rate ratio=50/500;
Pressure in the chamber=approximately 400 Pa (3 Torrs);
Microwave Power=0.8 kW;
Wafer temperature=400° C.; and
Processing time=60 seconds.

(3) Control (no curing processing carried out).

From FIGS. 8 and 9, according to the present invention in which plasma ignition was carried out after the $H_2$ gas was introduced, each of the Si—$CH_3$/Si—O ratio and the Si—H/Si—O ratio had an approximately constant value, without regard to a measurement depth from the vicinity of a surface. In contrast thereto, in the comparison example in which plasma ignition was carried out before the $H_2$ introduction, the Si—$CH_3$/Si—O ratio was low in the vicinity of the film surface, and, contrary thereto, the Si—H/Si—O ratio was high in the vicinity of the film surface. This was presumably because, in the vicinity of the surface of the SiOCH film, a methyl groups were eliminated by a function of the Ar ions.

Next, an influence of a pressure and an $H_2$ concentration during curing processing was studied.

Figure 10:
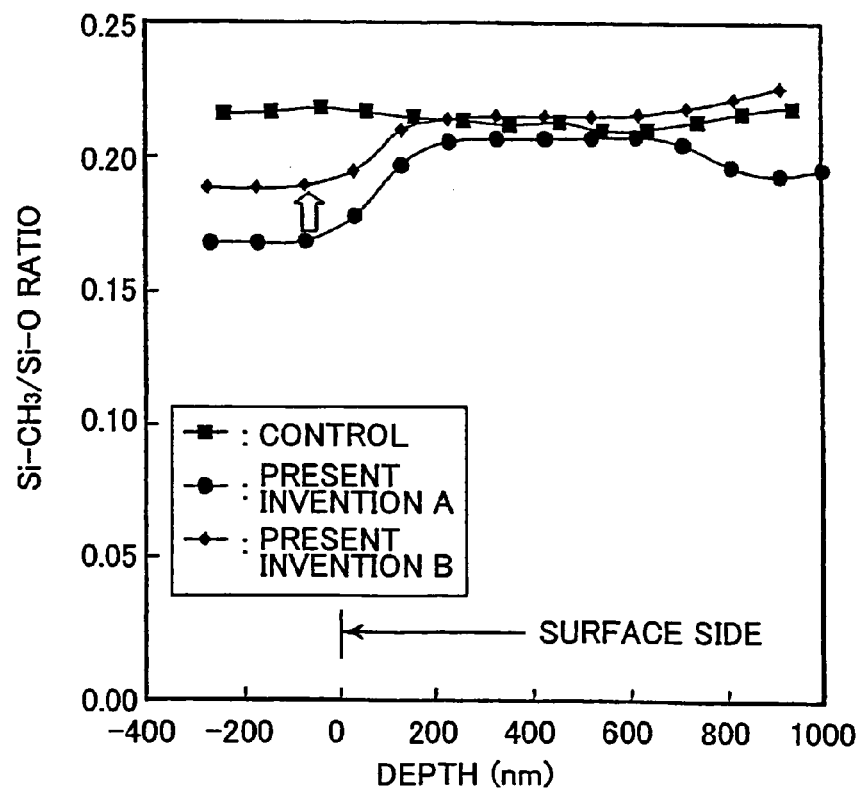
FIG. 10 shows a relationship between a depth of an SiOCH film and a Si—$CH_3$/Si—O ratio according to the present invention.
Figure 11:
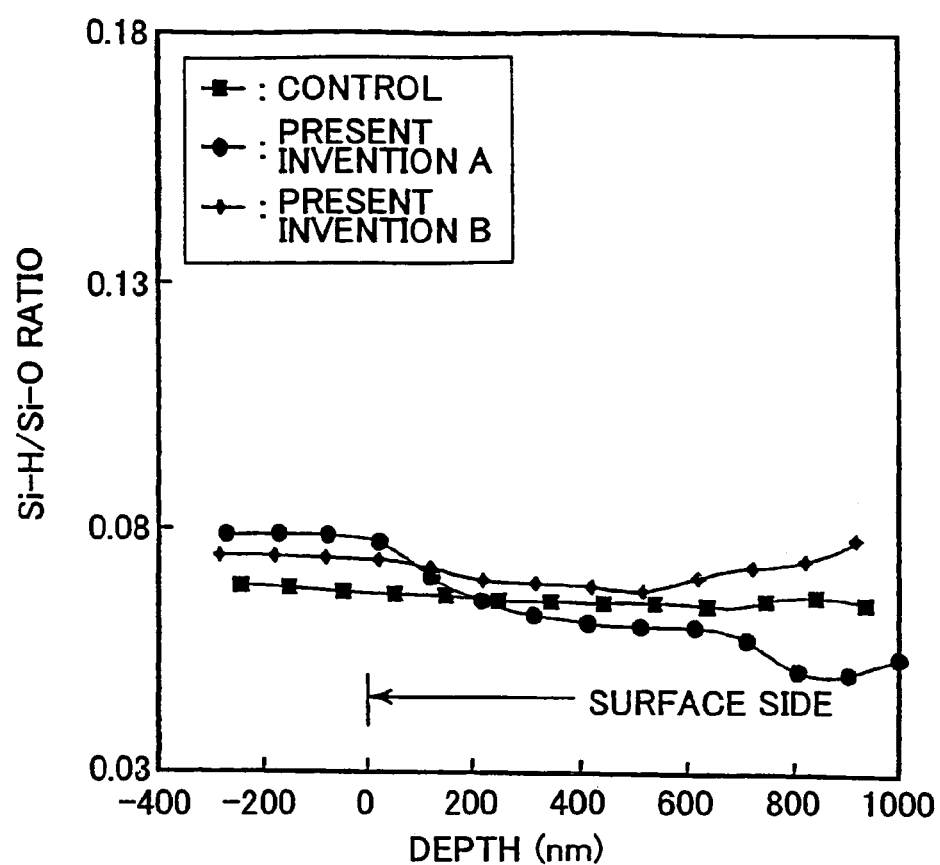
FIG. 11 shows a relationship between a depth of an SiOCH film and a Si—H/Si—O ratio according to the present invention.

After curing processing was carried out in the following conditions, each film was cut obliquely from a surface to a foundation layer, and a composition analysis was carried out on the cut surface in FT-IR. FIG. 10 shows a relationship between a depth of the cut surface (nm) and a ratio between Si—$CH_3$ and Si—O (Si—$CH_3$/Si—O). FIG. 11 shows a relationship between a depth of the cut surface (nm) and a ratio between Si—H and Si—O (Si—H/Si—O).

<Curing Processing Condition>

(1) Present Invention A (ignition after $H_2$ gas introduction):
Ar/$H_2$ gas flow rate ratio=250/500 (1:2);
Pressure in the chamber=approximately 266.6 Pa (2 Torrs);
Microwave Power=2 kW;
Wafer temperature=400° C.; and
Processing time=60 seconds.

(2) Present Invention B (ignition after $H_2$ gas introduction, high pressure and high $H_2$ conditions):
Ar/$H_2$ gas flow rate ratio=50/500 (1:10);
Pressure in the chamber=approximately 400 Pa (3 Torrs);
Microwave Power=2 kW;
Wafer temperature=400° C.; and
Processing time=60 seconds.

(3) Control (no curing processing carried out).

From FIGS. 10 and 11, it can be seen that the Si—$CH_3$/Si—O ratio on the film surface increased, and thus, elimination of methyl groups was further inhibited, in a case where the plasma ignition was made after the $H_2$ gas introduction with the ratio Ar:$H_2$=1:10, in comparison to the case of the ratio Ar:$H_2$=1:2. From this result, it has been seen that, in terms of improvement of film quality obtained after the curing, curing processing should be carried out preferably in a high $H_2$ gas ratio in which generation of active hydrogen such as hydrogen radicals (H*) increased there. Further, it has been also seen that, a further satisfactory result could be obtained as a result of the pressure being increased.

Next, curing processing was carried out according to a present invention method and a comparison method in the following conditional types, respectively, and an influence of the curing processing on film characteristics of a SiOCH film, i.e., a dielectric constant and a film shrinkage factor, was studied:

(1) Comparison Method (ignition before $H_2$ gas introduction):
  Ar/$H_2$ gas flow rate ratio=250/500 mL/min. (sccm);
  Pressure in the chamber=approximately 266.6 Pa (2 Torrs);
  Microwave Power=2 kW;
  Wafer temperature=400° C.; and
  Processing time=60 seconds.

(2) Present Invention (ignition after $H_2$ gas introduction, high pressure and high $H_2$ conditions):
  Ar/$H_2$ gas flow rate ratio=50/500 mL/min. (sccm);
  Pressure in the chamber=approximately 400 Pa (3 Torrs);
  Microwave Power=0.8 kW;
  Wafer temperature=400° C.; and
  Processing time=60 seconds.

Figure 12:
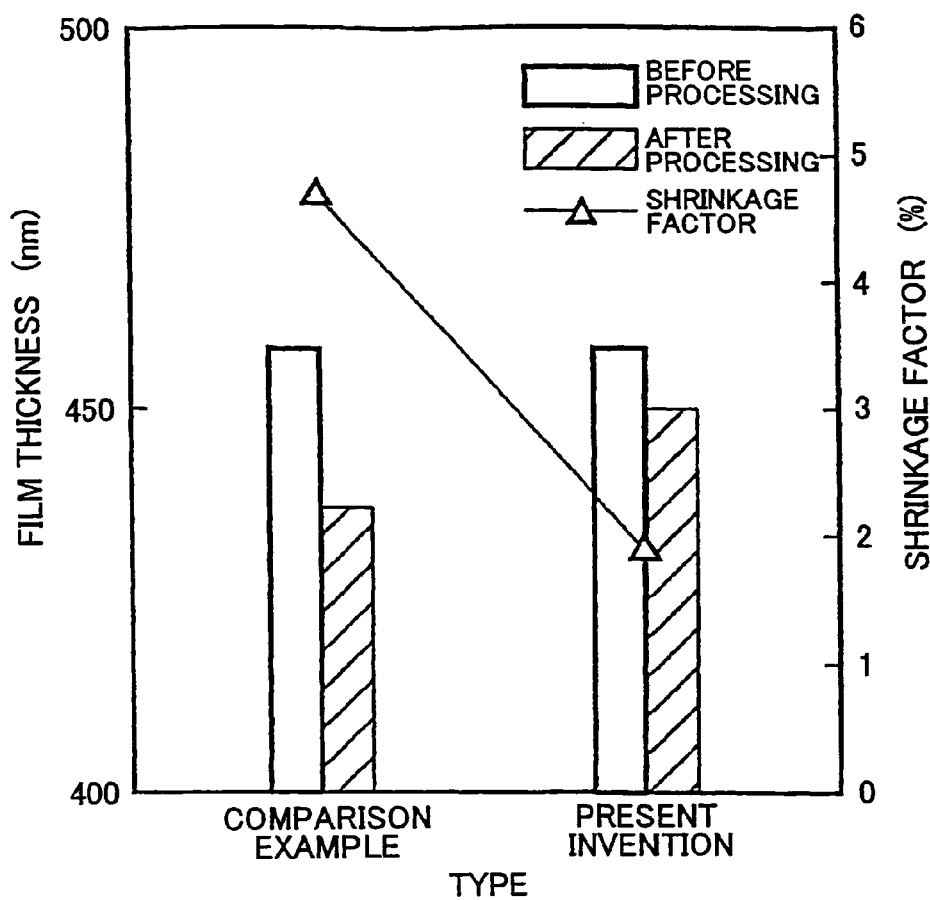
FIG. 12 shows a film thickness and a film shrinkage factor of an SiOCH film before and after curing processing in a comparison example and in the present invention.

First, a film thickness before and after the curing processing, and a film shrinkage factor through the curing processing were measured. FIG. 12 shows the results. From FIG. 12, in the SiOCH film after the curing processing in which the ignition was made after the $H_2$ gas introduction according to the present invention method, a reduction in a film thickness was small, and a film shrinkage factor was small in comparison to the SiOCH film undergoing the curing processing in which the Ar ignition was made before the $H_2$ gas introduction according to the comparison method. Therefrom, it has been proved that, according to the present invention method, curing processing could be carried out without a much reduction in a film thickness of the SiOCH film.

Figure 13:
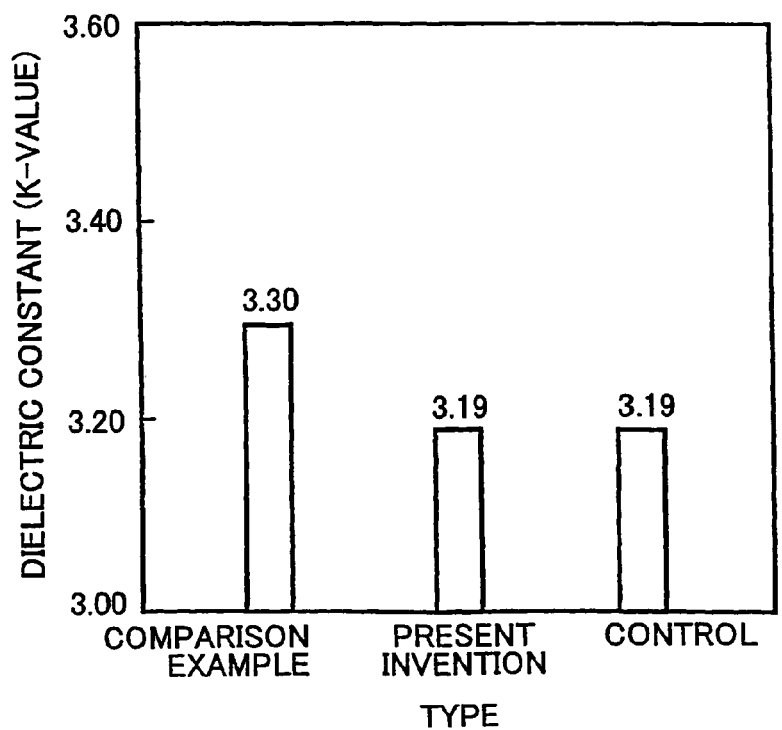
FIG. 13 shows a dielectric constant of an SiOCH film before and after curing processing in a comparison example and in the present invention.

Further, FIG. 13 shows a result of measurement of a dielectric constant (k-value) of the SiOCH film after the curing processing. From FIG. 13, a k-value of the SiOCH film cured according to the present invention method was smaller than a k-value of the SiOCH film cured according to the comparison method, and was approximately equivalent to the control (before the processing).

Further, FIG. 14 shows IR spectrums of the films obtained through the curing according to the present invention method and the comparison method (where an absorbance was shown in a normalized value). It is seen that, the SiOCH film cured according to the present invention has a larger peak exhibiting Si—$CH_3$ bondings, as well as an elimination of methyl groups was inhibited, in comparison to the SiOCH film cured according to the comparison method. That is, it is presumed that, in the curing processing in which the Ar plasma ignition was made before the $H_2$ gas introduction, Si—H was likely to be generated as a result of Si—$CH_3$ bondings being broken, while breakage of Si—$CH_3$ bondings was inhibited in the processing in which the Ar+$H_2$ plasma ignition was made after the $H_2$ gas introduction.

Furthermore, when electric characteristics of a semiconductor device employing the SiOCH film obtained from the present invention method were measured, a parasitic capacitance between interconnections and a leakage current are equivalent to those of an SiOCH film obtained from the prior art method.

Next, curing processing was carried out according to the present invention method and the comparison method in the following conditional types, and hardnesses of an SiOCH film before the curing processing (control) and the SiOCH film after the curing processing were measured by a nanoindenter.

(Condition 1) Comparison Method (ignition before $H_2$ gas introduction):
  Ar/$H_2$ gas flow rate ratio=250/500 mL/min. (sccm);
  Pressure in the chamber=approximately 266.6 Pa (2 Torrs);
  Microwave Power=2 kW;
  Wafer temperature=400° C.; and
  Processing time=60 seconds.

(Condition 2) Present Invention (ignition after $H_2$ gas introduction):
  Ar/$H_2$ gas flow rate ratio=250/500 mL/min. (sccm);
  Pressure in the chamber=approximately 266.6 Pa (2 Torrs);
  Microwave Power=2 kW;
  Wafer temperature=400° C.; and
  Processing time=60 seconds.

(Condition 3) Present Invention (ignition after $H_2$ gas introduction, high pressure and high $H_2$ conditions):
  Ar/$H_2$ gas flow rate ratio=50/500 mL/min. (sccm);
  Pressure in the chamber=approximately 400 Pa (3 Torrs);
  Microwave Power=2 kW;
  Wafer temperature=400° C.; and
  Processing time=60 seconds.

FIG. 15 shows a hardness distribution inside the film measured by the nanoindenter. From FIG. 15, a harder surface cured layer existed in the vicinity of the surface in comparison to a film inner part, in the condition 1 (Ar plasma ignition before $H_2$ gas introduction according to the comparison method). In contrast thereto, in the condition 2 and condition 3 (Ar/$H_2$ plasma ignition after $H_2$ gas introduction according to the present invention), it has been proved that, a hardness gently increased for a film inter part, and thus, a surface cured layer did not exist.

From these results, it has been seen that, in the plasma processing apparatus 100, as a result of a timing of plasma ignition being controlled, an influence of Ar ions on a Low-k film can be eliminated or reduced, processing can be carried out with plasma in which active hydrogen is dominant, the entirety of the low dielectric constant film can be uniformly cured, and thus, the low dielectric constant film having high adherence performance and superior film quality can be obtained.

Although the embodiments of the present invention have been described above, the present invention is not limited thereto, and many variants should be available.

For example, although the RLSA microwave plasma processing apparatus 100 has been described with reference to FIG. 1, any other type of a plasma processing apparatus, i.e., a parallel flat plate type one, a remote plasma type one, an ICP type one, an ECR type one, a magnetron type one, a surface reflected wave type one or such, may be applied instead.

Further, as the to-be-processed substrate, a substrate of silicon, an LCD, a compound semiconductor or such, may be applied.

Further, the present invention is not limited to the above-described embodiments, and variations and modifications may be made without departing from the basic concept of the present invention claimed below.

The present application is based on Japanese Priority Application No. 2004-324713, filed on Nov. 9, 2004, the entire contents of which are hereby incorporated herein by reference.

What is claimed is:

1. A plasma processing method for carrying out curing processing on a low dielectric constant film produced on a to-be-processed substrate by applying plasma thereto in a processing chamber of a plasma processing apparatus, comprising the steps of:
  a) introducing, in the plasma processing chamber, a first gas having a function of stabilizing plasma and a second gas generating active hydrogen, both the first gas and the second gas being introduced for a predetermined period of time with no generation of plasma; and
  after the predetermined period of time has elapsed, b) generating plasma, and carrying out curing processing on the low dielectric constant film.

2. A plasma processing method for carrying out curing processing on a low dielectric constant film produced on a to-be-processed substrate by applying plasma thereto in a processing chamber of a plasma processing apparatus, comprising the steps of:
- a) introducing, in the plasma processing chamber, a first gas having a function of stabilizing plasma, and a second gas generating active hydrogen, both the first gas and the second gas being introduced for a predetermined period of time with no generation of plasma; and
- after the predetermined period of time has elapsed, b) introducing microwave in the processing chamber with the use of a planar antenna having a plurality of slots, generating plasma of the first gas and the second gas, and carrying out curing processing on the low dielectric constant film.

3. The plasma processing method as claimed in claim 1, wherein:
said first gas comprises an inert gas, and said second gas comprises an $H_2$ gas.

4. The plasma processing method as claimed in claim 2, wherein:
said first gas comprises an inert gas, and said second gas comprises an $H_2$ gas.

5. The plasma processing method as claimed in claim 3, wherein:
a processing pressure lies in a range of 13.3 to 1333 [Pa].

6. The plasma processing method as claimed in claim 4, wherein:
a processing pressure lies in a range of 13.3 to 1333 [Pa].

7. The plasma processing method as claimed in claim 3, wherein:
a flow rate ratio between the inert gas and the $H_2$ gas (inert gas : $H_2$ gas) lies in a range of 1:2 to 1:20.

8. The plasma processing method as claimed in claim 4, wherein:
a flow rate ratio between the inert gas and $H_2$ gas (inert gas : $H_2$ gas) lies in a range of 1:2 to 1:20.

9. The plasma processing method as claimed in claim 1, wherein:
said low dielectric constant film comprises any one of a SiOCH series film, a SiOC series film, an MSQ series film and an organic polymer series film.

10. The plasma processing method as claimed in claim 2, wherein:
said low dielectric constant film comprises any one of a SiOCH series film, a SiOC series film, an MSQ series film and an organic polymer series film.

11. A film forming method comprising the steps of:
- a) forming a low dielectric constant film on a to-be-processed substrate in a manner of plasma CVD; and
- b) carrying out curing processing on the low dielectric constant film by causing plasma to function thereto, wherein:
said step b) comprises the steps of:
- b1) introducing, in a plasma processing chamber, a first gas having a function of stabilizing plasma, and a second gas generating active hydrogen, both the first gas and the second gas being introduced for a predetermined period of time with no generation of plasma, and,
- after the predetermined period of time has elapsed b2) generating plasma in a processing chamber, and carrying out curing processing on the low dielectric constant film.

12. The plasma processing method as claimed in claim 3, wherein:
the inert gas comprises any one of Ar, Kr, He and Xe.

13. The plasma processing method as claimed in claim 4, wherein:
the inert gas comprises any one of Ar, Kr, He and Xe.

* * * * *